United States Patent [19]
Cubizolles et al.

[11] Patent Number: 5,844,204
[45] Date of Patent: Dec. 1, 1998

[54] DEVICE FOR DETECTION OF ELECTRIC CURRENT BY MICRO-LEAKAGE

[75] Inventors: Serge Cubizolles, Lyons; Christian Giovalle, Moidieu-Detourbe, both of France

[73] Assignee: SEB S.A., Ecully, France

[21] Appl. No.: 617,789

[22] PCT Filed: Sep. 23, 1994

[86] PCT No.: PCT/FR94/01111

§ 371 Date: Mar. 22, 1995

§ 102(e) Date: Mar. 22, 1995

[87] PCT Pub. No.: WO95/08870

PCT Pub. Date: Mar. 30, 1995

[30] Foreign Application Priority Data

Sep. 24, 1993 [FR] France ................... 93 11624

[51] Int. Cl.$^6$ .................. H03K 17/96; D06F 75/08
[52] U.S. Cl. .................. 219/257; 219/509; 38/82; 38/77.1; 200/293.1; 361/179
[58] Field of Search .................. 219/256–259, 219/245, 530, 540, 518, 509; 38/74, 75, 79–82, 93, 77.1–77.9; 200/52 R, 600, DIG. 2, 332.2, 293.1; 361/179

[56] References Cited

U.S. PATENT DOCUMENTS

| | | | |
|---|---|---|---|
| 3,651,391 | 3/1972 | Vogelsberg | 318/446 |
| 3,798,462 | 3/1974 | Rizzo | 307/116 |
| 4,168,443 | 9/1979 | Periot | 307/308 |
| 4,203,101 | 5/1980 | Towsend | 219/257 |
| 4,531,287 | 7/1985 | Shibata et al. | 200/600 |
| 4,546,235 | 10/1985 | Kolter | 219/230 |
| 4,859,869 | 8/1989 | Heuwinkel et al. | 307/117 |
| 5,042,179 | 8/1991 | van der Meer | 38/77.83 |
| 5,380,983 | 1/1995 | Cavada et al. | 219/250 |
| 5,453,644 | 9/1995 | Yap et al. | 307/116 |
| 5,583,386 | 12/1996 | Meixner et al. | 200/600 |
| 5,595,672 | 1/1997 | Sham et al. | 219/257 |

FOREIGN PATENT DOCUMENTS

| | | |
|---|---|---|
| 0 012 044 | 6/1980 | European Pat. Off. . |
| 0 390 264 | 10/1990 | European Pat. Off. . |
| 228 945 | 10/1984 | German Dem. Rep. . |
| 24 30 110 | 1/1976 | Germany . |
| 90 05 890 | 5/1991 | Germany . |
| 1-107800 | 4/1989 | Japan . |
| 4-114699 | 4/1992 | Japan . |
| 2021771 | 12/1979 | United Kingdom . |
| 2 154 322 | 9/1985 | United Kingdom . |
| 2 199 962 | 7/1988 | United Kingdom . |
| 8203520 | 10/1982 | WIPO .................... 219/257 |
| WO 92/19905 | 11/1991 | WIPO . |

*Primary Examiner*—John A. Jeffery
*Attorney, Agent, or Firm*—Loeb & Loeb LLP

[57] ABSTRACT

A detection device associated with an electrical apparatus for detecting by contact the presence of a user, composed of an electronic circuit for detecting a presence of a user by detecting a leakage current traversing, at least partially, a portion of the body of the user using the electric apparatus when the body portion comes into contact with an electric contact providing for the transmission of the leakage current from the electronic circuit to the portion of the user's body.

14 Claims, 4 Drawing Sheets

DEVICE FOR DETECTION OF ELECTRIC CURRENT BY MICRO-LEAKAGE

TECHNICAL FIELD

The invention relates to the field of presence detection applied to electrical appliances.

The present invention concerns more particularly a device for detecting an electric current by microleakage, by the intermediary of a contact between the user and an electric appliance, in order to monitor and/or control the operation of said appliance. Such a device is particularly well adapted for its utilization on household appliances and particularly clothes pressing irons, but it is obvious that such a device can be utilized in any domestic or industrial electric appliance which must present an ease and security of utilization.

PRIOR ART

It is already known in the prior art to utilize a leakage current to detect a presence by contact. The operation of such devices is often altered either by a non-constant insulation between a user of said device and ground, or by a reversal of the electrical connection of said devices.

It is thus known through the document DE-U-9005890 to provide a detection device with which a part of the body of a user forms an electric bridge between electric contact means. These latter are connected to an electronic circuit in a manner to optimize the power dissipated in a soldering iron, and this is a function of the gripping of said iron by the user. The electronic circuit comprises a generator of pulses which are transported by the electric bridge between the contact means. The above-cited document also describes a modified embodiment of such a device with a single electric contact means permitting transmission to the electronic circuit of a signal coming from ambient electromagnetic noise when the user comes in contact with the electric contact means. The device thus described in this document presents the inconvenience of not taking account on the one hand of a possible alteration in the electric insulation of the user with respect to ground and on the other hand of utilizing means for amplification and filtration of the signal not contributing to the simplification of the electronic circuit.

The object of the present invention is to furnish an electrical appliance of the household type for example, comprising a system for detecting the presence of the hand of the user on said electric appliance.

Another object of the present invention consists in furnishing an electronic detection circuit which is particularly simply and reliable regardless of the degree of electric insulation of the user of an electric appliance comprising a detection device, with respect to ground, and regardless of the direction of electric contact means of said appliance.

A supplemental object of the present invention is to furnish users of electric appliances, and particularly electric household appliances for example, a device in which the structural and electronic means employed are simple and inexpensive.

An additional object of the present invention is to furnish household electric appliances for example, which are more comfortable to use, as well as an improved safety of utilization.

SUMMARY OF THE INVENTION

The objects of the invention are achieved with the aid of a detection device associated with an electric appliance and an electronic circuit, to detect a leakage current flowing at least partially through a portion of the body of a user of the electric appliance when that body part is in contact with electrical connection means arranged on a holding means of the appliance, thus assuring the transmission of leakage current from the electronic circuit to the body of the user, and permitting control of at least one part of the operation of the electric appliance by, respectively, a contact or a separation between the handle and the user, characterized in that each electric contact means is connected to a leakage current detection stage, in a manner to permit a detection when the leakage current circulates between the electric contact means, and when said current circulates between one of the contact means and ground.

BRIEF DESCRIPTION OF THE DRAWINGS

Other particularities and advantages of the invention will appear and come forth in greater detail from a reading of the description given hereafter, in reference to the attached drawings, given by way of illustrative and non-limiting examples in which.

BEST MODE OF PRACTICING THE INVENTION

In the detailed description that will follow, reference is made more particularly to a presence detection device for a clothes pressing iron, but it is obvious that the invention is not limited to this particular exception.

Figure 1:
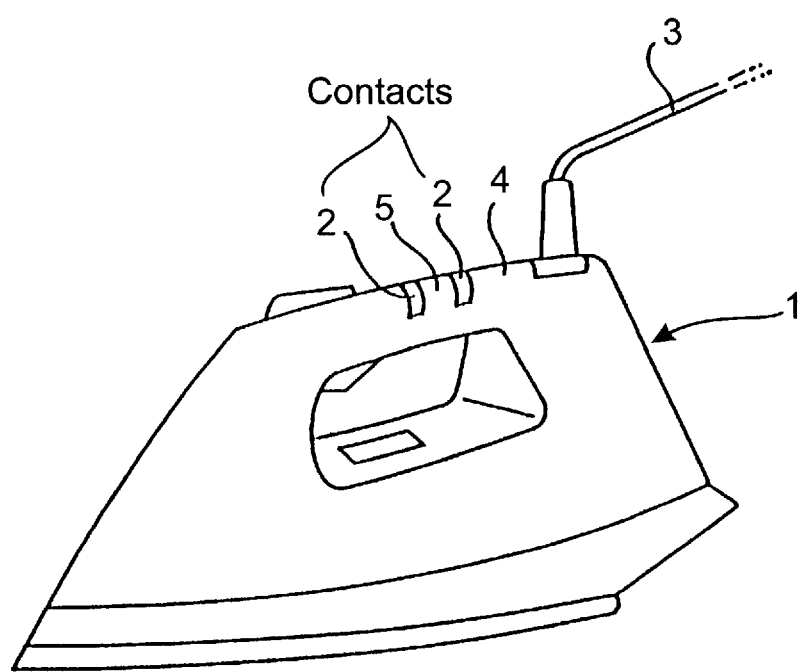
FIG. 1 represents an overall view of a clothes pressing iron comprising a detection device according to the invention.

FIG. 1 represents a general view, in perspective, of a clothes pressing iron 1 comprising a presence detection according to the invention. The detection device is thus utilized on an electric apparatus of the household type.

Pressing iron 1 is constituted notably by a handle 5, a supply cord 3 and electric contact means 2. These latters are made of an electrically conductive material. Thus, the electric contact means are arranged on a handle of an electric appliance. Advantageously, the electric contact means are preferably constituted by two metal bars arranged on handle 4 of pressing iron 1.

The electric contact means 2 are constituted by two metal bars connected to electronic circuit 10 by two connection points (C1, C2) and electrically insulated from one another by a spacing, in a manner to permit the part of the user's body which comes in contact with said electric contact means 2 to perform the function of an electric bridge, either between the metallic bars, or between one of the metallic bars and earth. The metallic bars are integrated perfectly into the ergonomics of the handle 4.

The electric contact means 2 are electrically insulated from one another by the intermediary of a portion 5 of the handle 4 made of an electrical insulating material. The separation of the electric contact means is advantageously between 1 and 30 mm and preferably equal to 5 mm.

According to another embodiment of the detection device according to the invention, the electronic circuit 10 is arranged in an external unit and separated from the electric appliance in electrical connection with said electrical appliance. The electric connection is preferably achieved by the supply cord 3.

The electrical contact means 2 are disposed on the handle 4 or arranged in housings provided to this effect and arranged in said handle 4, in a manner to present a conductive surface accessible to the hand of a user of the iron, when said hand comes in contact with handle 4.

The electronic detection circuit 10 is directly connected to the electric supply mains. The same is true for the heating elements (FIG. 2), contained in the pressing iron. The connection to the electric supply mains of the electronic circuit 10 can be done notably with the aid of the supply cord 3. This latter can also serve, according to another embodiment of the pressing iron comprising a detection device according to the invention, to furnish steam to the iron during pressing.

The device according to the invention is mounted for example on an electrical appliance comprising heating means for which the electrical supply is controlled by the electric circuit 10, as a function of the appearance or the disappearance of the leakage current.

The device can also be mounted on an electric appliance comprising means for producing steam, which is automatically commanded by the intermediary of the leakage current.

Figure 2:
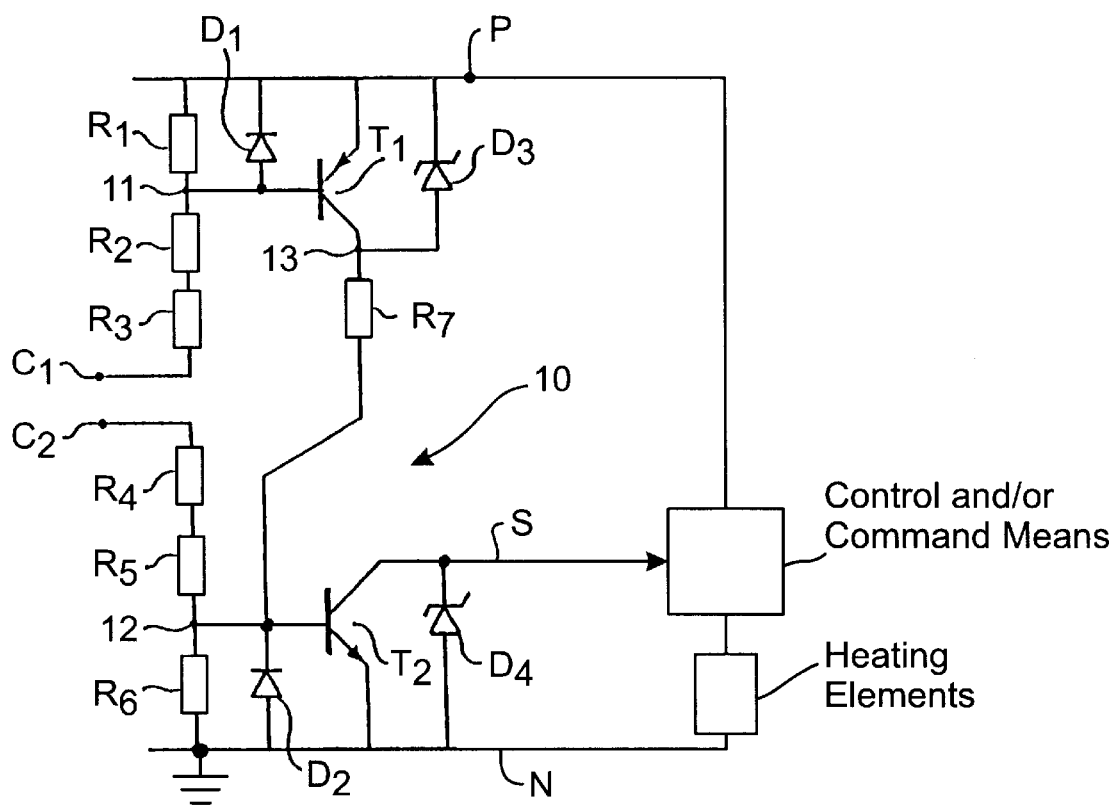
FIG. 2 represents an electronic schematic of the electronic detection circuit according to the invention.

FIG. 2 represents an electronic circuit diagram of electronic circuit 10 according to the invention. The detection means of the electronic circuit are constituted notably by two detection stages each comprising a bipolar transistor.

The first stage comprises thus a bipolar transistor T1, resistances R1, R2 and R3, a diode D1, as well as a Zener diode D3.

The emitter of transistor T1 is connected directly to a mains supply terminal P. The base 11 of transistor T1 is connected to the terminal P through a resistance R1, which is connected in parallel with a diode D1 on the one hand and the base 12 is connected to a supply terminal N through a resistance R6 connected in parallel with a diode D2 on the other hand. The diode D1 is intended to protect the base-emitter junction of the transistor T1. The resistance R1 permits application of a voltage to the base 11 of transistor T1 when said resistance R1 is traversed by an electric current. The Zener diode D3 is connected between the collector 13 of the transistor T1 and the terminal P in a manner to maintain the electric voltage between terminal P and the collector 13 below a value substantially equal to 100 V, in order to protect the emitter-collector junction presented by transistor T1.

The second detection stage comprises a transistor T2 whose emitter is connected directly to a mains supply terminal N. One of the detection stages is thus connected to the live wire and the other is connected to a neutral point of the electric supply mains. The collector S of transistor T2 is connected to a control and/or regulation unit.

The base 12 of transistor T2 is connected to the terminal N through a resistance R6, which presents a diode D2 connected in parallel with said resistance R6 in a manner to protect the base-emitter junction of transistor T2. The resistance R6 permits applying a voltage on base 11 when said resistance R6 is traversed by a current. The emitter-collector junction is protected by a Zener diode D4. This latter is thus connected between the collector S of the transistor T2 and the terminal N.

The electronic circuit, represented in FIG. 2, presents bipolar transistors T1 and T2, the emitters of which are connected to an electric supply, the collector 13 of the first transistor Ti being connected to the base 12 of the second transistor T2 through a resistance R7, and the collector S of the second transistor T2 being connected to a control and/or command means (FIG. 2) of an electric appliance.

The two detection stages are thus connected electrically by the intermediary of the resistance R7.

The electronic circuit presents contact points C1, C2, each of which is connected on the one hand to an electric contact means 2, and on the other hand to the base of a bipolar transistor T1, T2. The contact points C1, C2 are advantageously provided under the electric contact means 2.

The contact point C1 is connected to the base 11 of transistor T1, through a resistance R2 and a resistance R3 connected in series.

The contact point C2 is connected to the base 12 of transistor T2, through a resistance R4 and a resistance R5 connected in series.

Each detection stage thus presents a bipolar transistor T1, T2 of which the bases 11, 12 are connected respectively to the contact points C1, C2 through electric resistances R2, R3 and R4, R5.

The resistances R1, R2, R3, R4, R5, R6 and R7 are selected in a manner to produce only a weak electric leakage current, of a maximum intensity lower than 0.7 milli-Amperes and preferentially inferior to 0.2 milli-Amperes in order to not endanger the user who handles the pressing iron 1, for example.

For this purpose, the preferred ohmic values for the resistances R1, R2, R3, R4, R5, R6 and R7 are respectively substantially equal to 47,000 ohms for R1, 1,000 ohms for R2, R3, R4 and R5, 68,000 ohms for R6 and 470,000 ohms for R7.

Moreover, the ohmic values are advantageously selected in order to detect with the aid of bipolar transistors T1 and T2 a very weak current whose intensity is superior to 7 micro-Amperes.

It is obvious that the choice of different ohmic values in the electronic circuit 10 does not in any way alter the functioning of the device and does not depart, consequently, from the framework of the present invention.

The electronic circuit (10) is constituted by two detection stages connected to an electric contact means 2, by the intermediary of contact points C1, C2, in order to detect in at least one of the detection stages a leakage current circulating between ground and one of the electric contact means 2, while passing through the user's body.

According to another embodiment of the electronic circuit 10 according to the invention, it is envisioned to utilize field effect transistors by making certain modifications to the structure of the electronic circuit 10.

According to one mode of operation of the preferred embodiment of the detection device according to the invention, the terminal P and the terminal N correspond respectively to the live wire and the neutral of the electric supply mains. Reversal of the live wire and the neutral of the electrical supply do not in any way alter the proper operation of the detection device.

Electronic detection circuit permits detection of an electric leakage current circulating between electric contact means 2, advantageously through a hand, for example, of the handler of the pressing iron 1.

The electronic circuit 10 equally permits detecting an electric leakage current circulating in one of the electric contact means toward ground through the hand of the user of the pressing iron, which comes in contact with said electric contact means 2.

The functioning of the device is thus assured independently of the electric insulation which can exist between the user and ground.

When the user does not have his hands on the handle 4 of the pressing iron 1 no electric current permits production of an electric signal on the collector S of the bipolar transistor T2.

When the user or the handler of the pressing iron 1 brings his hand onto the handle 4 and consequently onto the electrical contact means 2, two situations can be presented.

In the first situation, the user is significantly electrically insulated with respect to ground. Thus, a small electric leakage current circulates from the contact point C1 toward the contact point C2, through the electric contact means 2 and the user's hand. Each positive alternation of the mains provokes an electric signal on the base 12 of transistor T2 which detects in this manner the presence of the user's hand on the handle 4, if the user is not found at ground.

In the second situation, the user is not, or weakly, electrically insulated with respect to ground. A weak electric leakage current thus circulates from one to the other of contact points C1 or C2 toward ground.

In this illustrative case, the contact with a sole electrical contact means 2 can suffice to attain a signal on the collector S when one of the detection stages, connected to the hot wire of the mains is brought to ground by the intermediary of a contact point C1, C2.

The supply terminal P is for example connected to the hot wire of the mains, which has for its consequence, for each positive half cycle, to produce an electric current from the emitter toward the collector of the transistor T1, due to the electric voltage present at the terminals of the resistance R1 which provokes saturation of transistor T1. The base 12 of the transistor T2 is supplied in this manner, and a signal is obtained on the collector S of said transistor T2.

If the supply terminal P is for example connected to the neutral of the mains, which is connected to ground, it is equally the positive mains half cycle which produces a signal directly on the collector S of the transistor T2. The device according to the invention thus detects the presence of a part of the body of a user by positive mains half cycles.

It is thus that the second detection state, comprising the bipolar transistor T2 which is active. In effect, when the terminal N is connected on the live wire of the mains, a current circulating through resistances R6, R5 and R4 toward ground via contact point C2 provokes an electric signal on the base 12. When the user is not insulated relative to ground, the contact of said user with the single contact point C2 is sufficient to obtain a signal on the collector S.

No electrical signal is produced on the collector S as long as the user is no longer in contact with the electrical contact means.

Figure 3:
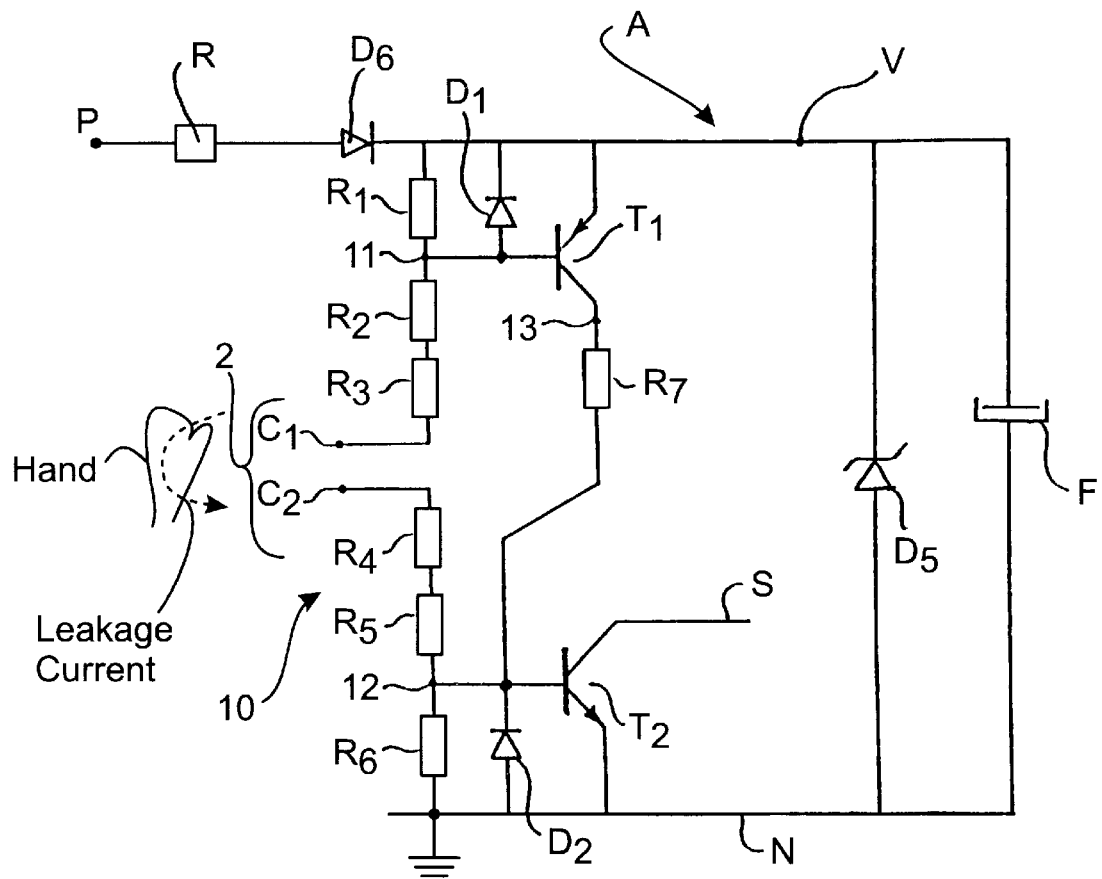
FIG. 3 represents another form of construction of the electronic detection circuit according to the invention.

According to another embodiment of the electronic circuit 10, represented in FIG. 3, said electronic circuit is associated with an electric supply A furnishing a constant electric voltage to the detection stages. The electric supply A is constituted by a resistance R in series with a diode D6, which are connected between the terminal P and a terminal V, as well as a capacitor F, in parallel with a Zener diode D5, connected between terminal V and terminal N.

According to a connection example, terminal P is on the live wire of the mains.

The resistance R permits a drop in the voltage at the terminal V. Diode P6 and capacitor F thus provide a constant filtered supply. In addition, the Zener diode D5 permits maintaining the supply voltage A at a potential for example below 24 Volts at the terminal V and to consequently select the characteristics of bipolar transistors T1, T2 utilized in the detection stages.

The electronic circuit 10 is thus sensitive to different illustrative cases which can be presented during utilization of the electrical appliance furnished with a device according to the invention.

When the user is at ground, the functioning of the electronic circuit 10 is identical to the functioning of the first embodiment of said circuit shown in FIG. 2.

When the user is insulated from ground, the leakage current between the contact points C1 and C2 is obtained by the electric supply A furnishing a substantially constant voltage to the terminal V.

The presence of a signal on the collector S thus permits control, in real time, of various functions achievable by an electrical appliance such as a pressing iron for example. Such functions correspond notably to the generation of steam, to the electrical supply of heating elements.

A device according to the invention thus permits automatically controlling an electrical appliance comprising means for producing steam, by the intermediary of a leakage current.

It is envisionable to control the functioning of luminous indicators, or other organs present in the electric appliances for the care of a person, of the electrical massaging type, electrical hair dryers, epilators and razors particularly.

One advantage of the presence detection device according to the invention resides in the general utilization of said device. It is utilizable on all electrical appliances of all types and even on appliances comprising an isolating transformer. In this exact case, the detection is simplified, given that there is only one leakage current between the electrodes to detect. One of the detection stages can then be ineffective.

Another advantage of the device according to the invention is connected with the utilization of an electronic circuit 10, operational independently of the direction of connection to the mains or of the insulation which the user can present with respect to ground.

Another advantage of the device according to the invention resides in the reliability of such a detection system. In effect, the user can be more or less insulated with respect to ground, to present an insulation with respect to ground which is variable in time or to be in contact with only one of the constituent electrodes of the electric contact means. All of the possibilities of utilization, or a combination of these possibilities is detected by the device according to the invention, thus conferring on the device a great effectiveness. In addition, the sensitivity of the detection device can vary as a function of the selection of resistances R1 and R6. Advantageously, the resistances R1 and R6 are adjustable by the user in order to take account of the differences which the ohmic values of the electric resistance of the skin of the users can present, which resistances come in contact with the detection device.

A supplemental advantage of the device according to the invention resides in the improved security procured by such a device arranged on an electric appliance. In effect, one can envision an interruption of the electrical supply or of the steam supply for a pressing iron, when the user or the handler no longer touches, with the hand for example, the electric contact means 2.

The utilization comfort of such an electrical household appliance is thus improved.

An additional advantage of the detection device according to the invention resides in the utilization of an electronic circuit 10 which can on the one hand be combined with any other monitoring, regulation or operation control means of an electric appliance and on the other hand be arranged on the appliance itself or in an external unit associated and electrically connected with said appliance. An electronic card can equally be placed in the handle 4 in order to manage, or generate, data from physical size sensors.

One advantage of the electric circuit 10 according to the invention resides in its conception which is simple, economical and adapted to the utilization of structural means, of the electrical contact means 2, which are not cumbersome, are easily adaptable to all types of electrical appliances and are very inexpensive.

Figure 4:
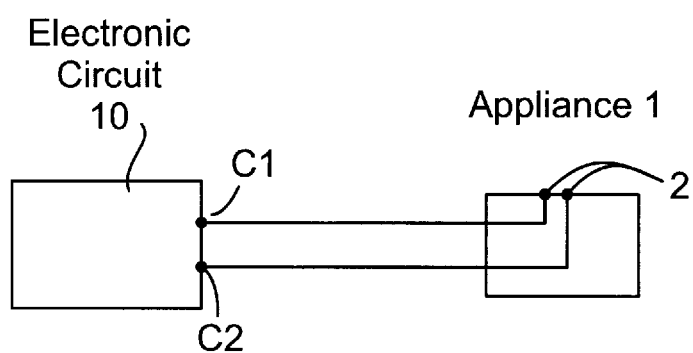
FIG. 4 is a block diagram showing one arrangement which can be provided between an electronic circuit and an appliance in accordance with the present invention.

FIG. 4 shows an arrangement in which the electronic circuit 10 is arranged in a unit which is external to, and separated from, the associated electric appliance 1, but is electrically connected to electric appliance 1 via conductors that lead to contact points C1, C2.

INDUSTRIAL APPLICATION POSSIBILITIES

The invention finds its industrial application in the field of electrical appliances intended to be held in the hand by the user of said appliance, and notably steam pressing irons.

The invention claimed is:

1. Detection device associated with an electric appliance and an electronic circuit (10) to detect a leakage current traversing, at least partially, a portion of the body of a user of the electric appliance when said body part comes in contact with electric contact means (2) arranged on a handle means of the appliance, thus assuring transmission of the leakage current from the electronic circuit (10) toward the body of the user, and permitting control of at least one part of the functioning of the electric appliance by, respectively, a contact or a separation between the handle means and the user, characterized in that said electric contact means comprise two electric contacts (2) electrically insulated from one another and each connected to a respective leakage current detection stage, in a manner to permit a detection when the leakage current circulates between the electric contacts (2), and to permit a detection when said current circulates between one of the electric contacts (2) and ground.

2. Device according to claim 1 characterized in that the electric contacts (2) are constituted by two metal bars connected to the electronic circuit (10) by contact points (C1, C2) and electrically insulated from one another by a space, in a fashion to permit the portion of the body of the user which comes in contact with said electric contacts (2) to form an electric bridge either between the metal bars or between one of the metal bars and ground.

3. Device according to one of claim 1 characterized in that the electronic circuit (10) is constituted by two detection stages connected to an electric contacts (2) by the intermediary of contact points (C1, C2) in order to detect in at least one of the detection stages a leakage current circulating between ground and one of the electric contacts (2) while traversing the body of the user.

4. Device according to claim 3 characterized in that one of the detection stages is connected to the live wire and the other is connected to the neutral of the electric supply mains.

5. Device according to one of claim 3 characterized in that each detection stage presents a bipolar transistor (T1, T2) of which the bases (11, 12) are connected respectively to the contact points (C1, C2) through electric resistances (R2–R3, R4–R5).

6. Device according to claim 5 characterized in that the bipolar transistors (T1, T2) present emitters connected to an electric supply, the collector of the first transistor (Ti) being connected to the base (12) of the second transistor (T2) through a resistance (R7), and the collector (S) of the second transistor (T2) being connected to a monitoring and/or controls of an electric appliance.

7. Device according to claim 6 characterized in that the base (11) of the transistor (T1) is connected to a supply terminal (P) through a resistance (R1) which is connected in parallel with a diode (D1) on the one hand and the base (12) is connected to a supply terminal (N) through a resistance (R6) connected in parallel with a diode (D2).

8. Device according to one of claim 3 characterized in that the electronic circuit (10) is associated with an electric supply A, furnishing a direct electric voltage to the detection stages.

9. Device according to claim 1 characterized in that said device is mounted on an electric appliance comprising heating means of which the electric supply is controlled by the electronic circuit (10) as a function of the appearance or the disappearance of the leakage current.

10. Device according to claim 1 characterized in that said device is mounted on an electric appliance comprising steam producing means, which is controlled automatically by the intermediary of the leakage current.

11. Device according to claim 1 characterized in that the electronic circuit (10) is arranged in a unit which is external and separated from the electric appliance in electric connection with said electric appliance.

12. Household electrical appliance comprising a detection device according to claim 1.

13. Steam pressing iron comprising a detection device according to claim 1.

14. Electric appliance for personal care comprising a detection device according to claim 1.

* * * * *